(12) United States Patent
Ueno et al.

(10) Patent No.: US 10,780,675 B2
(45) Date of Patent: Sep. 22, 2020

(54) GAS BARRIER FILM, OPTICAL FILM, AND FLEXIBLE DISPLAY

(71) Applicant: SUMITOMO CHEMICAL COMPANY, LIMITED, Tokyo (JP)

(72) Inventors: Toshiyuki Ueno, Tsukuba (JP); Yasuhiro Yamashita, Tsukuba (JP); Mitsunori Nodono, Tsukuba (JP); Satoshi Okamoto, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 15/597,914

(22) Filed: May 17, 2017

(65) Prior Publication Data
US 2017/0334177 A1 Nov. 23, 2017

(30) Foreign Application Priority Data
May 20, 2016 (JP) .................................. 2016-101869

(51) Int. Cl.
*G02B 1/14* (2015.01)
*B32B 27/08* (2006.01)
(Continued)

(52) U.S. Cl.
CPC ................ *B32B 27/08* (2013.01); *B05D 3/12* (2013.01); *C08J 7/042* (2013.01); *C08J 7/0423* (2020.01);
(Continued)

(58) Field of Classification Search
CPC ........... B32B 9/00; B32B 9/005; B32B 9/007; B32B 9/04; B32B 9/045; B32B 18/00;
(Continued)

(56) References Cited

U.S. PATENT DOCUMENTS

| 6,441,491 B1 * | 8/2002 | Grill | ................ | H01L 21/02126 257/759 |
| 2004/0195659 A1 * | 10/2004 | Grill | ................ | H01L 21/02126 257/632 |

(Continued)

FOREIGN PATENT DOCUMENTS

| JP | 2003-195271 A | 7/2003 |
| JP | 2010111450 A | * 5/2010 |

(Continued)

OTHER PUBLICATIONS

Machine translation (JPlatPat) of JP 2010-111450 A. Translated Oct. 28, 2019. (Year: 2019).*

(Continued)

*Primary Examiner* — Maria V Ewald
*Assistant Examiner* — Ethan A. Utt
(74) *Attorney, Agent, or Firm* — Birch, Stewart, Kolasch & Birch, LLP (57) ABSTRACT

This invention provides a gas barrier film, which can suppress blocking and winding deviation, and an optical film using the gas barrier film.
The gas barrier film includes a flexible substrate and an inorganic thin film layer formed on at least one surface of the flexible substrate. A static friction coefficient between one surface of the gas barrier film and the other surface is not less than 0.85 and not more than 2.0, and when a 50 mm-square portion cut from the gas barrier film is placed on a horizontal surface such that a central portion of the 50 mm-square portion is in contact with the horizontal surface, an average value of distances from the horizontal surface to four corners of the 50 mm-square portion is not more than 2 mm.

24 Claims, 4 Drawing Sheets

(51) Int. Cl.
  *C23C 16/40* (2006.01)
  *C23C 16/509* (2006.01)
  *C23C 16/54* (2006.01)
  *C08J 7/04* (2020.01)
  *B05D 3/12* (2006.01)
  *C08J 7/18* (2006.01)
  *C23C 14/58* (2006.01)

(52) U.S. Cl.
  CPC .............. *C08J 7/18* (2013.01); *C23C 14/5886* (2013.01); *C23C 16/401* (2013.01); *C23C 16/509* (2013.01); *C23C 16/545* (2013.01); *G02B 1/14* (2015.01); *C08J 2345/00* (2013.01)

(58) Field of Classification Search
  CPC ......... B32B 27/00; B32B 27/06; B32B 27/08; Y10T 428/31667; H01L 51/52; H01L 51/5237; H01L 51/5253; H01L 51/5256
  USPC ............... 428/688, 689, 697, 446, 448, 451, 428/698–702
  See application file for complete search history.

(56) References Cited

U.S. PATENT DOCUMENTS

| | | | | |
|---|---|---|---|---|
| 2009/0104443 | A1* | 4/2009 | Suzuki | B32B 27/325 428/483 |
| 2009/0159857 | A1* | 6/2009 | Uehira | C08J 5/18 252/585 |
| 2012/0099054 | A1* | 4/2012 | Takeuchi | H01L 51/5281 349/98 |
| 2012/0249900 | A1* | 10/2012 | Koike | G02F 1/133528 349/15 |
| 2014/0224517 | A1* | 8/2014 | Hasegawa | B32B 9/04 428/447 |
| 2014/0308494 | A1* | 10/2014 | Iwaya | H01L 51/5256 428/216 |
| 2015/0099094 | A1* | 4/2015 | Suzuki | B32B 27/08 428/141 |
| 2015/0099126 | A1* | 4/2015 | Honda | H01L 51/5253 428/447 |
| 2015/0249228 | A1* | 9/2015 | Inoue | H01L 51/5256 428/216 |
| 2016/0343986 | A1* | 11/2016 | Inoue | H01L 51/5253 |
| 2017/0334177 | A1* | 11/2017 | Ueno | B32B 27/08 |

FOREIGN PATENT DOCUMENTS

| | | | | |
|---|---|---|---|---|
| JP | 2013256391 A | * | 12/2013 | |
| JP | 2014-168934 A | | 9/2014 | |
| WO | WO 2013/147090 A1 | | 10/2013 | |
| WO | WO-2014050743 A1 | * | 4/2014 | ......... H01L 51/5256 |
| WO | WO-2015115337 A1 | * | 8/2015 | ............. B32B 27/08 |

OTHER PUBLICATIONS

Machine translation (JPlatPat) of JP 2013-256391 A. Translated Oct. 28, 2019. (Year: 2019).*

* cited by examiner

GAS BARRIER FILM, OPTICAL FILM, AND FLEXIBLE DISPLAY

BACKGROUND OF THE INVENTION

Field of the Invention

The present invention relates to a gas barrier film, an optical film, and a flexible display.

Description of the Related Art

In the conventional art, a gas barrier film used for an organic EL display and the like has been known.

PRIOR ART DOCUMENTS

Patent Documents

[Patent Document 1] WO 2013/147090 A
[Patent Document 2] JP-A-2014-168934
[Patent Document 3] JP-A-2003-195271

SUMMARY OF THE INVENTION

However, in conventional gas barrier films, it has been found that blocking in which films are wound up around a roll and then stick to each other in the roll and winding deviation in which a position of an end surface of a film is shifted axially when the film is wound around a roll apt to occur.

The invention is made in the light of the above-mentioned problem, and provides a gas barrier film, which can suppress blocking and winding deviation, and an optical film using the gas barrier film.

A gas barrier film of the present invention includes a flexible substrate and an inorganic thin film layer formed on at least one surface of the flexible substrate. A static friction coefficient between one surface of the gas barrier film and the other surface is not less than 0.85 and not more than 2.0, and when a 50 mm-square portion cut from the gas barrier film is placed on a horizontal surface such that a central portion of the 50 mm-square portion is in contact with the horizontal surface, an average value of distances from the horizontal surface to four corners of the 50 mm-square portion is not more than 2 mm.

Here, when any one surface of the gas barrier film is observed by a white-light interference microscope, an arithmetic average roughness Ra may be not less than 3 nm.

A water vapor permeability of the gas barrier film at 40° C. and 90% RH may be not more than 0.1 g/m²/day or not more than 0.001 g/m²/day.

The inorganic thin film layer may contain a silicon atom, an oxygen atom, and a carbon atom.

An optical film of the present invention includes the gas barrier film, a λ/4 phase difference film, and a linear polarizer layer.

Here, the optical film may further include a λ/2 phase difference film.

The λ/4 phase difference film may have reverse wavelength dispersibility.

In the gas barrier film, the flexible substrate may be a λ/4 phase difference film. The flexible substrate may have reverse wavelength dispersibility.

Another optical film of the present invention includes the gas barrier film and a linear polarizer layer.

Here, the optical film may further include a λ/2 phase difference film.

The optical film may further include an adhesive bonding layer provided on the other surface of the gas barrier film.

Here, after storage for 500 hr under environments at 85° C. and 85% RH, adhesive strength between the gas barrier film and the adhesive bonding layer may be not less than 500 gf/10 mm.

A water diffusion coefficient in an in-plane direction of the adhesive bonding layer may be not more than 0.05 mm²/hr under environments at 60° C. and 90% RH.

The flexible display of the present invention includes the gas barrier film or the optical film.

The present invention provides the gas barrier film, which can suppress blocking and winding deviation, and the optical film using the gas barrier film.

DETAILED DESCRIPTION OF THE PREFERRED EMBODIMENTS

Hereinafter, an embodiment of the present invention will be described with reference to the drawings.

Figure 1A:
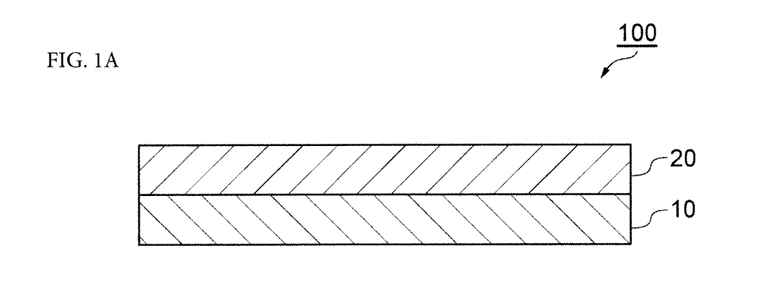
FIGS. 1A and 1B are cross-sectional schematic views of a gas barrier film according to an embodiment of the present invention.
Figure 1B:
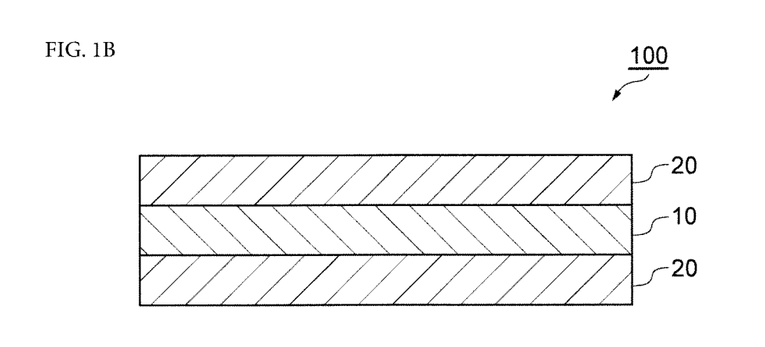

As shown in FIGS. 1A and 1B, a gas barrier film 100 according to the present embodiment includes a flexible substrate 10 and an inorganic thin film layer 20 to be formed on at least one surface of the flexible substrate 10. As shown in FIG. 1A, the inorganic thin film layer 20 may be provided on only one surface of the flexible substrate 10. As shown in FIG. 1B, the inorganic thin film layer 20 may be provided on both surfaces of the flexible substrate 10.

Flexible Substrate 10

The flexible substrate 10 is a flexible thin film capable of holding the inorganic thin film layer 20. Examples of the flexible substrate 10 include a resin film, and a colorless transparent resin film is preferably used.

Examples of resins include polyester resins such as polyethylene terephthalate (PET) and polyethylene naphthalate (PEN); polyolefin resins such as polyethylene (PE), polypropylene (PP), and cyclic polyolefin; polyamide resin; polycarbonate resin; polystyrene resin; polyvinyl alcohol resin; saponification product of ethylene-vinyl acetate copolymer; polyacrylonitrile resin; acetal resin; polyimide resin; and polyether sulfide (PES). Two or more of these may be combined as necessary. Among these resins, in accordance with required characteristics such as transparency, heat resistance properties, and linear expansion properties, selection from polyester resins and polyolefin resins is preferable, and PET, PEN, and cyclic polyolefin are more preferably used.

The flexible substrate 10 may be an unstretched resin substrate or a stretched resin substrate produced by stretching the unstretched resin substrate through a known process, such as uniaxial stretching, successive biaxial stretching with a tenter, simultaneous biaxial stretching with a tenter, or simultaneous biaxial stretching of tubular film, in the direction (MD direction) of the flow of the resin substrate and/or a direction (TD direction) orthogonal to the flow of the resin substrate.

The flexible substrate 10 may be a laminate composed of two or more layers of the resins listed above.

When the flexible substrate 10 has a plurality of layers, a layer in direct contact with the inorganic thin film layer 20 may have a layer functioning as a planarization layer for planarizing a surface of another layer. Examples of the planarization layer include a resin layer such as an acrylic UV curable resin.

The thickness of the flexible substrate 10 may be appropriately set taking into consideration stability and the like at the time of manufacture of a gas barrier film 100, but 5 to 500 μm is preferable, because conveyance of the flexible substrate 10 even in a vacuum is facilitated. When the inorganic thin film layer 20 is formed by a plasma CVD method to be described later, the thickness of the flexible substrate 10 is more preferably 10 to 200 μm and still more preferably 15 to 100 μm.

A layer constituting the flexible substrate 10 may be a phase difference film in which refractive indexes of two orthogonal components in a plane are different from each other, such as a λ/4 phase difference film or a λ/2 phase difference film. Examples of a material of a phase difference film may include a cellulose-based resin, a polycarbonate-based resin, a polyarylate-based resin, a polyester-based resin, an acrylic-based resin, a polysulfone-based resin, a polyether sulfone-based resin, a cyclic olefin-based resin, and an alignment fixed layer of a liquid crystal compound. Among those materials, a polycarbonate-based resin film is preferably used since an inexpensive and uniform film is available. As a method of forming a film, a solvent cast method, a precision extrusion method that can reduce residual stress of a film, or the like can be used, and the solvent cast method is preferably used in terms of uniformity. A stretching method is not particularly limited, and longitudinal uniaxial stretching between rolls, tenter crosswise uniaxial stretching, or the like can be applied such that uniform optical characteristics can be obtained.

When the layer constituting the flexible substrate 10 is a λ/4 phase difference film, an in-plane phase difference Re (550) at a wavelength of 550 nm may be 100 nm to 180 nm, preferably 110 nm to 170 nm, and more preferably 120 nm to 160 nm.

When the layer constituting the flexible substrate 10 is a λ/2 phase difference film, the in-plane phase difference Re (550) at a wavelength of 550 nm may be 220 nm to 320 nm, preferably 240 nm to 300 nm, and more preferably 250 nm to 280 nm.

When the flexible substrate 10 is a phase difference film, the flexible substrate 10 may exhibit reverse wavelength dispersibility in which a phase difference value increases according to the wavelength of measurement light, positive wavelength dispersion characteristics in which a phase difference value decreases according to the wavelength of measurement light, or flat wavelength dispersion characteristics in which a phase difference value is hardly changed even by the wavelength of measurement light.

If the flexible substrate 10 is a phase difference film exhibiting the reverse wavelength dispersibility, when a phase difference at wavelength λ of the flexible substrate 10 is represented by Re(λ), the flexible substrate 10 can satisfy Re(450)/Re(550)<1 and Re(650)/Re(550)>1.

From the viewpoint of adhesion with the inorganic thin film layer 20 and the like, surface active treatment may be conducted on a surface of the flexible substrate 10 in order to clean its surface. Examples of the surface active treatment include corona treatment, plasma treatment, and flame treatment for example.

Inorganic Thin Film Layer 20

As the inorganic thin film layer 20, a layer of an inorganic material having known gas barrier properties can be suitably used. Examples of the inorganic material include metal oxides, metal nitrides, metal oxide-nitrides, metal oxide-carbides, and mixtures of at least two of them. In addition, as the inorganic material, a multilayer film formed by stacking two or more of the above thin film layers may be used.

In particular, the inorganic thin film layer 20 preferably contains at least a silicon atom (Si), an oxygen atom (O), and a carbon atom (C) from the viewpoint of capable of exhibiting a more advanced water vapor permeation prevention performance and from the viewpoints of bending resistance, ease of manufacture, and low manufacturing cost.

In this case, the inorganic thin film layer 20 may be mainly composed of a compound represented by a general formula of $SiO_\alpha C_\beta$. Here, the expression "being mainly composed of" means that the content of the component is not less than 50% by mass, preferably not less than 70% by mass, and more preferably not less than 90% by mass with respect to the total mass of components in the material. In this general formula, $\alpha$ is selected from positive numbers of less than 2, and $\beta$ is selected from positive numbers of less than 2. At least one of $\alpha$ and $\beta$ in this general formula may be a constant value or may be varied in the thickness direction of the inorganic thin film layer 20. When at least one of $\alpha$ and $\beta$ vary in the thickness direction, each value of $\alpha$ or $\beta$ changes in a manner, e.g. periodically repeating increase or decrease, in the thickness direction of the inorganic thin film layer 20.

It is preferred that, in the silicon distribution curve, the oxygen distribution curve, and the carbon distribution curve which are in the thickness direction of the inorganic thin film layer 20, the carbon distribution curve has at least one extremal value and the average value of the ratio of the carbon atoms number are not less than 11 at % and not more than 21 at %, from the viewpoint of capable of exhibiting a more advanced water vapor permeation prevention performance and from the viewpoint of bending resistance.

The inorganic thin film layer 20 may further contain other elements than a silicon atom, an oxygen atom, and a carbon atom, for example, at least one selected from the group consisting of a hydrogen atom, a nitrogen atom, a boron atom, an aluminum atom, a phosphorus atom, a sulfur atom, a fluorine atom, and a chlorine atom.

When the inorganic thin film layer 20 contains a hydrogen atom in addition to a silicon atom, an oxygen atom, and a carbon atom, the inorganic thin film layer 20 is preferably mainly composed of a compound represented by a general formula of $SiO_\alpha C_\beta H_\gamma$. Here, the expression "being mainly composed of" means that the content of the component is not less than 50% by mass, preferably not less than 70% by mass, and more preferably not less than 90% by mass with respect to the total mass of components in the material. In this general formula, $\alpha$ is selected from positive numbers of less than 2, $\beta$ is selected from positive numbers of less than 2, and γ is selected from positive numbers of less than 6. At least one of α, β, and γ in this general formula may be a constant value or maybe varied in the thickness direction of the thin film layer.

In the inorganic thin film layer 20, when an average atomic number ratio of carbon atoms (C) to silicon atoms (Si) in the inorganic thin film layer is represented by C/Si, the ratio preferably falls within the range of 0.10<C/Si<0.70. The upper value is more preferably less than 0.65, further preferably less than 0.50, further more preferably less than 0.45. The lower value is more preferably more than 0.15. The range is more preferably within the range of 0.20<C/Si<0.40, and particularly preferably within the range of 0.25<C/Si<0.35 from the viewpoints of increasing denseness and decreasing defects such as fine pores and cracks.

In the inorganic thin film layer 20, when an average atomic number ratio of oxygen atoms (O) to silicon atoms (Si) in the thin film layer is represented by O/Si, the ratio preferably falls within the range of 1.40<O/Si<1.90, more preferably within the range of 1.50<O/Si<1.90, further preferably within the range of 1.50<O/Si<1.85, further more preferably within the range of 1.55<O/Si<1.85, still more preferably within the range of 1.60<O/Si<1.80, and particularly preferably within the range of 1.65<O/Si<1.75 from the viewpoints of increasing denseness and decreasing defects such as fine pores and cracks.

The average atomic number ratios C/Si and O/Si can be determined by conducting XPS depth profile measurement in the following conditions, and determining average atomic concentrations in the thickness direction of respective atoms from obtained distribution curves of a silicon atom, an oxygen atom, and a carbon atom, and subsequently calculating the average atomic number ratios C/Si and O/Si.

XPS Depth Profile Measurement

Etching ion species: argon (Ar$^+$)
Etching rate (in terms of a SiO$_2$ thermally oxidized film): 0.05 nm/sec
Etching interval (in terms of SiO$_2$): 10 nm
X-ray photoelectron spectrometer: manufactured by Thermo Fisher Scientific Inc., model name "VG Theta Probe"
Irradiation X ray: single crystal spectroscopy AlKα
Spot of X-ray and size thereof: oval shape of 800×400 μm In the inorganic thin film layer 20, when infrared spectrometry (ATR method) is conducted on a surface of the inorganic thin film layer, an intensity ratio between a peak intensity ($I_1$) existing from 950 to 1050 cm$^{-1}$ and a peak intensity ($I_2$) existing from 1240 to 1290 cm$^{-1}$ may fall within the range satisfying the following formula (2):

$$0.01 \leq I_2/I_1 < 0.05. \quad (2)$$

A peak intensity ratio $I_2/I_1$ calculated from the infrared spectrometry (ATR method) is considered to represent a relative ratio of Si—CH$_3$ to Si—O—Si in the inorganic thin film layer 20. Since the inorganic thin film layer 20 satisfying the relationship represented by the formula (2) has high denseness and reduced defects such as fine pores and cracks, the inorganic thin film layer 20 is considered to be excellent in gas barrier properties and impact resistance. The range of the peak intensity ratio $I_2/I_1$ preferably falls within the range of 0.02 $I_2/I_1$<0.04 from the viewpoint of maintaining high denseness of the inorganic thin film layer 20.

When the range of the peak intensity ratio $I_2/I_1$ is satisfied, a gas barrier film 100 suitably easy to slip, and blocking further hardly occurs. On the other hand, if $I_2/I_1$ is high, that is, if the ratio of Si—C is too large, the flexibility tends to be poor and the film tends to be less likely to slip. If $I_2/I_1$ is low, that is, if the ratio of Si—C is too small, the flexibility tends to be low.

In the infrared spectrometry conducted on the surface of the inorganic thin film layer 20, the infrared spectrometry can be performed by using a Fourier transformation type infrared spectrophotometer (FT/IR-460Plus, manufactured by JASCO Corporation) equipped with an ATR attachment (PIKEMIRacle) using germanium crystals for a prism.

In the inorganic thin film layer 20, when the infrared spectrometry (ATR method) is conducted on the surface of the inorganic thin film layer, an intensity ratio between the peak intensity ($I_1$) existing from 950 to 1050 cm$^{-1}$ and a peak intensity ($I_3$) existing from 770 to 830 cm$^{-1}$ may fall within the range satisfying the following formula (3):

$$0.25 \leq I_3/I_1 \leq 0.50. \quad (3)$$

A peak intensity ratio $I_3/I_1$ calculated from the infrared spectrometry (ATR method) is considered to represent a relative ratio of Si—C, Si—O, or the like to Si—O—Si in the inorganic thin film layer 20. The inorganic thin film layer satisfying the relationship represented by the formula (3) is considered to maintain high denseness, at the same time be excellent in bending resistance since carbon is introduced thereto, and be excellent in impact resistance. From the viewpoint of keeping balance between the denseness and bending resistance of the inorganic thin film layer, the range of the peak intensity ratio $I_3/I_1$ preferably falls within the range of $0.25 \leq I_3/I_1 \leq 0.50$ and more preferably within the range of $0.30 \leq I_3/I_1 \leq 0.45$.

In the thin film layer, when the infrared spectrometry (ATR method) is conducted on the surface of the thin film layer, an intensity ratio between the peak intensity ($I_3$) existing from 770 to 830 cm$^{-1}$ and a peak intensity ($I_4$) existing from 870 to 910 cm$^{-1}$ may fall within the range satisfying the following formula (4):

$$0.70 \leq I_4/I_3 < 1.00. \quad (4)$$

A peak intensity ratio $I_4/I_3$ calculated from the infrared spectrometry (ATR method) is considered to represent a ratio between peaks associated with Si—C in the inorganic thin film layer 20. The inorganic thin film layer satisfying the relationship represented by the formula (4) is considered to maintain high denseness, at the same time be excellent in bending resistance since carbon is introduced thereto, and be excellent in impact resistance. From the viewpoint of keeping balance between the denseness and bending resistance of the inorganic thin film layer, the range of the peak intensity ratio $I_4/I_3$ preferably falls within the range of $0.70 \leq I_4/I_3 \leq 1.00$ and more preferably within the range of $0.80 \leq I_4/I_3 \leq 0.95$.

The thickness of the inorganic thin film layer 20 is preferably 5 to 3000 nm from the viewpoint of suppressing cracking of the inorganic thin film layer when the inorganic thin film layer is bent. When the thin film layer is formed by a plasma CVD method with the use of glow discharge plasma, the thickness is more preferably 10 to 2000 nm and still more preferably 100 to 1000 nm since the thin film layer is formed while electricity is discharged through the substrate.

The inorganic thin film layer 20 may have such a high density as an average density of not less than 1.8 g/cm$^3$. The "average density" of the inorganic thin film layer can be determined by calculating the weight of the thin film layer in the measurement range from the number of silicon atoms, the number of carbon atoms, and the number of oxygen atoms determined by the Rutherford Backscattering Spectrometry (RBS) and the number of hydrogen atoms determined by the Hydrogen Forward scattering Spectrometry (HFS), and dividing the weight by the volume of the thin film layer in the measurement range (product of irradiation area of ion beam and film thickness). Due to the fact that the inorganic thin film layer 20 has a density of not less than 1.8 g/cm$^3$, the inorganic thin film layer 20 has high denseness and a structure with little defects such as fine pores and cracks. When the inorganic thin film layer is composed of a silicon atom, an oxygen atom, a carbon atom, and a hydrogen atom, the average density of the inorganic thin film layer is preferably less than 2.22 g/cm$^3$.

Such a layer of an inorganic material containing a silicon atom, an oxygen atom, and a carbon atom is preferably formed by a chemical vapor deposition method (CVD method), and, in particularly, this layer is more preferably formed by a plasma chemical vapor deposition method (PECVD method) using glow discharge plasma or the like.

Examples of raw material gases include an organic silicon compound containing a silicon atom and a carbon atom. Examples of such organic silicon compounds include hexamethyl disiloxane, 1,1,3,3-tetramethyl disiloxane, vinyl trimethyl silane, methyl trimethyl silane, hexamethyl disilane, methyl silane, dimethyl silane, trimethylsilane, diethyl silane, propyl silane, phenyl silane, vinyl triethoxy silane, vinyl trimethoxy silane, tetramethoxy silane, tetraethoxy silane, phenyl trimethoxy silane, methyl triethoxy silane, and octamethyl cyclotetrasiloxane. Among these organic silicon compounds, from the viewpoints of the ease of handling of the compound, and characteristics such as gas barrier properties of the obtained inorganic thin film layer 20, hexamethyl disiloxane and 1,1,3,3-tetramethyl disiloxane are preferable. These organic silicon compounds can be used alone or in combination of two or more kinds.

A reaction gas which allows formation of an inorganic compound, such as an oxide or a nitride, upon reaction with the raw material gas can be suitably selected to be mixed with the raw material gas. For example, oxygen or ozone can be used as a reaction gas for forming an oxide. Meanwhile, for example, nitrogen or ammonia can be used as a reaction gas for forming a nitride. These reaction gases can be used alone or in combination of two or more kinds. For example, when an oxide-nitride is formed, a reaction gas for forming an oxide and a reaction gas for forming a nitride can be used in combination. The ratio of the flow rates of a raw material gas and a reaction gas can be suitably adjusted according to the atomic ratio of an inorganic material to be film-formed.

In order to supply the raw material gas into a vacuum chamber, a carrier gas may be used, if necessary. Moreover, in order to cause plasma discharge, an electrical discharge gas may be used, if necessary. As the carrier gas or the electrical discharge gas, any known gas can be suitably used. For example, a noble gas such as helium, argon, neon, or xenon; or hydrogen can be used.

In addition, the pressure (the degree of vacuum) in the vacuum chamber can be suitably adjusted in accordance with the kind of the raw material gas and the like. The pressure is preferably in the range from 0.5 Pa to 50 Pa.

In the gas barrier film 100 according to this embodiment, a static friction coefficient between one surface of the gas barrier film 100 and the other surface is not less than 0.85 and not more than 2.0.

The static friction coefficient maybe measured by dividing the gas barrier film 100 having an upper surface and a lower surface into two sheets and allowing the upper surface of the first gas barrier film 100 of the two sheets and the lower surface of the second gas barrier film 100 to be in contact with each other. The static friction coefficient can be measured in accordance with the inclination method stipulated in JIS P 8147 under environments at a temperature of 23° C. and a humidity of 50 RH %.

In order to adjust the static friction coefficient, surface roughness of both surfaces of the gas barrier film 100 may be adjusted. For example, as shown in FIG. 1A, when the inorganic thin film layer 20 is provided on only one surface of the flexible substrate 10, surface roughness of an exposed surface of the inorganic thin film layer 20 and surface roughness of an exposed surface of the flexible substrate 10 may be adjusted. As shown in FIG. 1B, when the inorganic thin film layers 20 are provided on both surfaces of the flexible substrate 10, surface roughness of an exposed surface of one of the inorganic thin film layers 20 and surface roughness of an exposed surface of the other inorganic thin film layer 20 may be adjusted. If the surface roughness of at least one of the surfaces of the gas barrier film 100 is increased, the static friction coefficient between front and rear surfaces tends to become small.

The surface roughness of the inorganic thin film layer 20 can be controlled according to conditions, such as a pressure (the degree of vacuum) in a vacuum chamber in film formation conditions of the inorganic thin film layer 20 and film formation thickness, and a composition or density (denseness) of an inorganic film-forming layer. It is preferred that the surface roughness is controlled by controlling a pressure in a vacuum chamber adequately and controlling a denseness of the inorganic thin film layer. When the inorganic thin film layer 20 is formed on both surface of the flexible substrate 10 as shown in FIG. 1(b), only one of the inorganic thin film layer 20 has the surface roughness not less than 3 nm by controlled a denseness thereof, and thereby both suppressing of blocking and having a water vapor permeation prevention performance can be realized. Further, the surface roughness of the inorganic thin film layer 20 can be adjusted by adjusting surface roughness of the flexible substrate 10 serving as a substrate and surface roughness of an intermediate layer disposed between the inorganic thin film layer 20 and the flexible substrate 10.

In order to adjust the surface roughness of the flexible substrate 10, treatment such as corona treatment may be performed.

An arithmetic average roughness Ra of the surface of the inorganic thin film layer 20 may be not less than 3 nm. The arithmetic average roughness Ra can be obtained by applying a gas barrier film onto an epoxy plate with adhesive and then observing the surface with a white-light interference microscope. The arithmetic average roughness Ra is an arithmetic average roughness according to JIS B0601 2001.

In the gas barrier film 100 according to this embodiment, when a 50 mm-square portion cut from the gas barrier film 100 is placed on a horizontal surface such that a central portion of the 50 mm-square portion is in contact with the horizontal surface, an average value of distances from the horizontal surface to curled four corners is not more than 2 mm.

This average value can be measured as follows. First, the gas barrier film 100 is held for 48 hours under conditions at a temperature of 23° C. and a humidity of 50 RH %. Then, a 50 mm-square portion is cut from the gas barrier film 100 to obtain a sample. The sample is placed on a horizontal surface such that a central portion of the sample is in contact with the horizontal surface, and four distances in total from the horizontal surface to four corners are obtained. Finally, an average value of the four distances is obtained.

In order to reduce curl of the gas barrier film 100 and enhance the flatness, stresses of inorganic thin film layers of front and rear surfaces may be balanced, stresses of the inorganic thin film layer of one surface and a coating layer under this inorganic thin film layer may be balanced, residual stress of the inorganic thin film layer itself may be reduced, or they may be combined to balance stresses of both surfaces. The stress can be adjusted by film formation pressure informing the inorganic thin film layer, film thickness, a degree of curing shrinkage in forming a coating layer, or the like.

A water vapor permeability of the gas barrier film 100 at 40° C. and 90% RH may be not more than 0.1 g/m$^2$/day or not more than 0.001 g/m$^2$/day.

The water vapor permeability can be measured by the apparatus and method disclosed in JP-A-2005-283561.

According to the gas barrier film 100 of this embodiment, blocking in which films are wound up around a roll and then stick to each other in the roll and winding deviation in which a position of an end surface of a film is shifted axially when the film is wound around a roll are suppressed. Although the reason is unknown, as one of the factors, due to high flatness of the gas barrier film 100, uniformity of stress at a contact surface is high when the film is tightly wound around a roll, and a portion contacting with locally high stress is less likely to be formed, so that blocking can be suppressed. As the other factor, films are less likely to slip each, other due to the fact that the static friction coefficient between front and rear surfaces of the gas barrier film 100 is large to some extent, so that winding deviation is less likely to occur.

Optical Film 200

Next, an optical film 200 according to the embodiment of the present invention will be described.

Figure 2A:
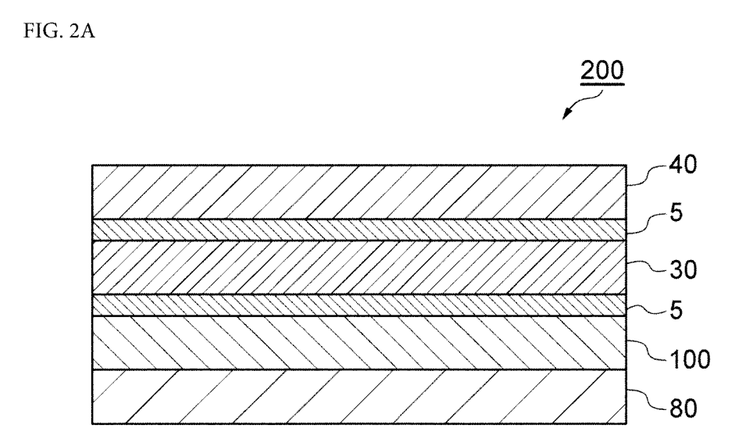
FIGS. 2A and 2B are cross-sectional schematic views of an optical film according to the embodiment of this invention.

The optical film 200 of FIG. 2A has an adhesive bonding layer 80, the gas barrier film 100, an adhesive bonding layer 5, a λ/4 phase difference film 30, an adhesive bonding layer 5, and a linear polarizer layer 40 in this order. The order of the λ/4 phase difference film 30 and the linear polarizer layer 40 above one surface of the gas barrier film 100 may be reversed.

Figure 2B:
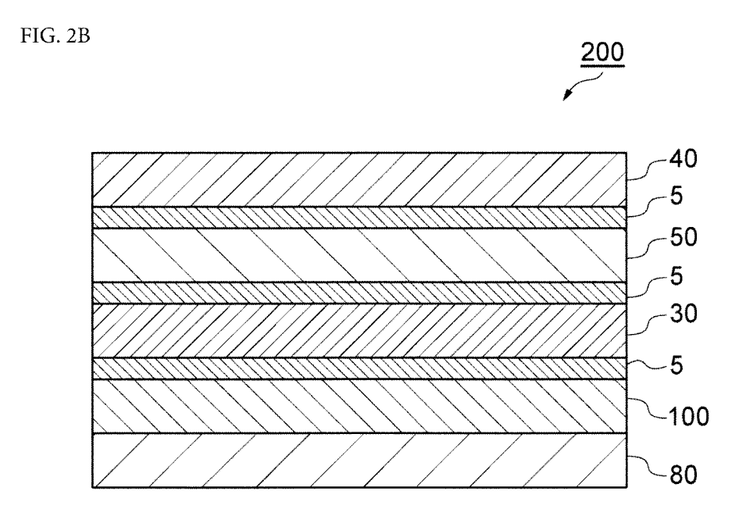

The optical film 200 of FIG. 2B has the adhesive bonding layer 80, the gas barrier film 100, the adhesive bonding layer 5, the λ/4 phase difference film 30, the adhesive bonding layer 5, a λ/2 phase difference film 50, the adhesive bonding layer 5, and the linear polarizer layer 40 in this order. The order of the λ/4 phase difference film 30, the λ/2 phase difference film 50, and the linear polarizer layer 40 above one surface of the gas barrier film 100 is not particularly limited and may be arbitrary.

Adhesive Bonding Layer

Examples of the adhesive bonding layers 5 and 80 include an adhesive layer and a bonding layer.

Adhesive Layer

The adhesive layer is preferably used as an adhesive for applying the optical film 200 to a flexible image display device. Examples of the adhesive layer include acrylic-based adhesives, silicone-based adhesives, and epoxy-based adhesives. The thickness of the adhesive layer may be 5 to 100 μm, for example, and preferably 5 to 50 μm. A release film may be applied onto a surface of the adhesive layer until the layer is used.

A water diffusion coefficient in an in-plane direction of the adhesive layer may be 0.05 mm$^2$/hr at a temperature of 60° C. and a humidity of 90% RH.

After storage for 500 hr under environments at 85° C. and 85% RH, adhesive strength according to JIS K 6854-2 between the gas barrier film 100 and the adhesive layer may be not less than 500 gf/10 mm.

Bonding Layer

The bonding layer is preferably used as a bonding agent for applying films to each other. Examples of the bonding layer include aqueous bonding agents such as polyvinyl alcohol-based bonding agents and cationic polymerization-based or radical polymerization-based active energy ray-curable bonding agents for example. The thickness of the bonding layer is 0.1 to 20 μm, for example, preferably 0.2 to 10 μm, and more preferably 0.5 to 5 μm.

After storage for 500 hr under environments at 85° C. and 85% RH, the adhesive strength according to JIS K 6854-2 between the gas barrier film 100 and the bonding layer may be not less than 500 gf/10 mm.

λ/4 Phase Difference Film

The λ/4 phase difference film 30 is a film functioning as a λ/4 plate, that is, a film giving a phase difference of π/2 (=λ/4) between a fast axis and a slow axis with respect to incident light.

The in-plane phase difference Re (550) at a wavelength of 550 nm of the λ/4 phase difference film 30 may be 100 nm to 180 nm, preferably 110 nm to 170 nm, and more preferably 120 nm to 160 nm.

The thickness of the λ/4 phase difference film 30 may be set such that the λ/4 phase difference film 30 can most suitably function as a λ/4 plate. In other words, the thickness may be set so as to obtain a desired in-plane phase difference. The thickness may be 1 μm to 80 μm, 10 μm to 60 μm, or 30 μm to 50 μm.

Examples of a material of the λ/4 phase difference film 30 may include a cellulose-based resin, a polycarbonate-based resin, a polyarylate-based resin, a polyester-based resin, an acrylic-based resin, polysulfone, polyether sulfone, a cyclic olefin polymer, and an alignment fixed layer of a liquid crystal compound. Among those materials, a polycarbonate-based resin film is preferably used since an inexpensive and uniform film is available. As a method of forming a film, a solvent cast method, a precision extrusion method that can reduce residual stress of a film, or the like can be used, and the solvent cast method is preferably used in terms of uniformity. A stretching method is not particularly limited, and longitudinal uniaxial stretching between rolls, tenter crosswise uniaxial stretching, or the like can be applied such that uniform optical characteristics can be obtained.

The λ/4 phase difference film 30 may exhibit reverse wavelength dispersibility in which a phase difference value increases according to the wavelength of measurement light, positive wavelength dispersion characteristics in which a phase difference value decreases according to the wavelength of measurement light, or flat wavelength dispersion characteristics in which a phase difference value is hardly changed even by the wavelength of measurement light.

When the λ/4 phase difference film 30 exhibits the reverse wavelength dispersibility, there is an effect of improving viewing angle compensation. In this case, when an in-plane phase difference at wavelength λ of the λ/4 phase difference film 30 is represented by Re(λ), the λ/4 phase difference film 30 can satisfy Re(450)/Re(550)<1 and Re(650)/Re(550)>1.

λ/2 Phase Difference Film 50

The λ/2 phase difference film 50 is a film functioning as a λ/2 plate, that is, a film giving a phase difference of π (=λ/2) between a fast axis and a slow axis with respect to incident light.

The in-plane phase difference Re (550) at a wavelength of 550 nm of the λ/2 phase difference film 50 may be 220 nm to 320 nm, preferably 240 nm to 300 nm, and more preferably 250 nm to 280 nm.

The thickness of the λ/2 phase difference film 50 may be set such that the λ/2 phase difference film 50 can most suitably function as a λ/2 plate. In other words, the thickness may be set so as to obtain a desired in-plane phase difference. Specifically, the thickness may be 1 µm to 80 µm, 10 µm to 60 µm, or 30 µm to 50 µm.

The material of the λ/2 phase difference film 50 and the production process thereof may be similar to those of the λ/4 phase difference film 30.

Linear Polarizer Layer 40

The linear polarizer layer 40 is a film having a linear polarizing function. Examples of the linear polarizer layer 40 include a stretched film to which a dye having absorption anisotropy is adsorbed or a film onto which a dye having absorption anisotropy is coated. Examples of the dye having absorption anisotropy include a dichroic dye such as iodine, and examples of substrates include a polyvinyl alcohol-based resin.

As one example of the process for producing the stretched film to which a dye having absorption anisotropy is adsorbed, a polarizer is produced through a process for uniaxially stretching a polyvinyl alcohol-based resin film, a process for dyeing the polyvinyl alcohol-based resin film with a dichroic dye to adsorb the dichroic dye, a process for treating with a boric acid aqueous solution the polyvinyl alcohol-based resin film to which the dichroic dye is adsorbed, and a process for water washing after treatment with the boric acid aqueous solution, and the stretched film is produced by sandwiching the produced polarizer between transparent protective films through a bonding agent applied onto at least one of the surfaces of the polarizer.

The thickness of the linear polarizer layer 40 may be 5 to 40 µm or 5 to 30 µm.

One or both of surfaces of the linear polarizer layer 40 may have a protective film such as a triacetylcellulose film.

In order to obtain circularly polarized light, the λ/4 phase difference film 30 and the linear polarizer layer 40 can be arranged such that a fast axis of the λ/4 phase difference film 30 and a transmission axis of the linear polarizer layer 40 cross at 45°

In the optical film 200 as shown in FIG. 2A, in addition to a gas barrier function, a function of converting linearly polarized light into circularly polarized light can be provided by the λ/4 phase difference film 30 and the linear polarizer layer 40. In the optical film 200 as shown in FIG. 2B, the reverse wavelength dispersibility can be given to the optical film 200 by further providing the λ/2 phase difference film 50 at a predetermined angle.

Since the gas barrier film 100 which can suppress blocking and winding deviation is used, there is an effect that it is possible to obtain an optical film without poor appearance such as flaws and with good surface quality.

Optical Film 300

Next, an optical film 300 according to the embodiment of the present invention will be described.

Figure 3A:
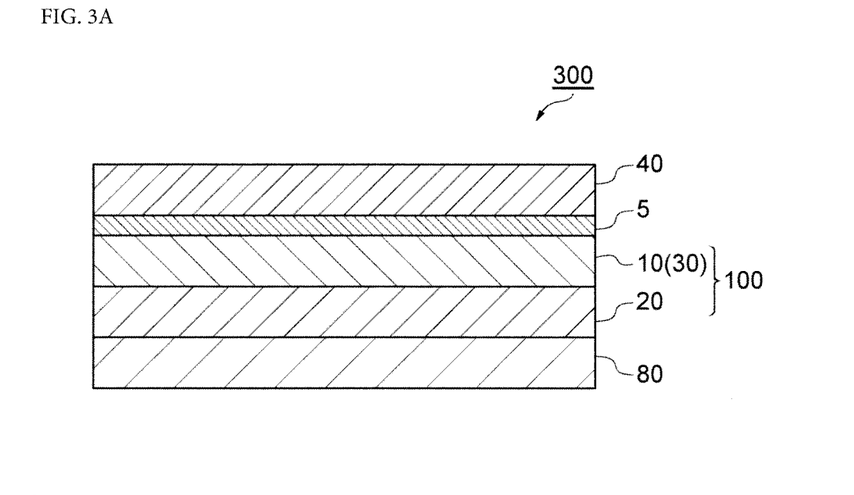
FIGS. 3A and 3B are cross-sectional schematic views of another optical film according to the embodiment of this invention.

The optical film 300 of FIG. 3A has the adhesive bonding layer 80, the gas barrier film 100, the adhesive bonding layer 5, and the linear polarizer layer 40 in this order. In this embodiment, as the flexible substrate 10 of the gas barrier film 100, the λ/4 phase difference film 30 of the optical film 200 is used.

Figure 3B:
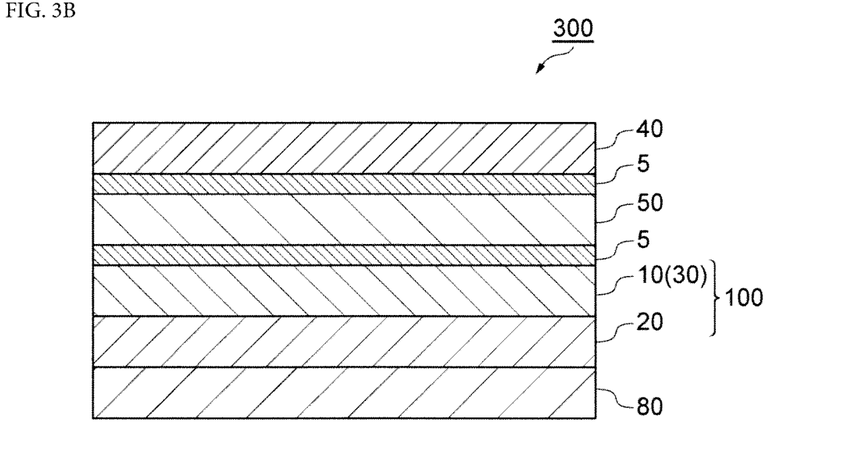

The optical film 300 of FIG. 3B has the adhesive bonding layer 80, the gas barrier film 100, the adhesive bonding layer 5, the λ/2 phase difference film 50, the adhesive bonding layer 5, and the linear polarizer layer 40 in this order. In this embodiment, as the flexible substrate 10 of the gas barrier film 100, the λ/4 phase difference film 30 of the optical film 200 is used. The order of the λ/2 phase difference film 50 and the linear polarizer layer 40 above the gas barrier film 100 may be reversed.

In FIGS. 3A and 3B, although the inorganic thin film layer 20 is provided on only a surface on the adhesive bonding layer 80 side of the gas barrier film 100, the inorganic thin film layer 20 may be further provided on the sides of the linear polarizer layer 40 and the λ/2 phase difference film 50.

In the optical film 300 as shown in FIG. 3A, in addition to the gas barrier function, the function of converting linearly polarized light into circularly polarized light can be provided by the λ/4 phase difference film 30 and the linear polarizer layer 40. In the optical film 200 as shown in FIG. 2B, the reverse wavelength dispersibility can be given to the optical film 300 by further providing the λ/2 phase difference film 50 at a predetermined angle.

Since the gas barrier film 100 which can suppress blocking and winding deviation is used, there is an effect that it is possible to obtain an optical film without poor appearance such as flaws and with good surface quality.

Flexible Display

Figure 4:
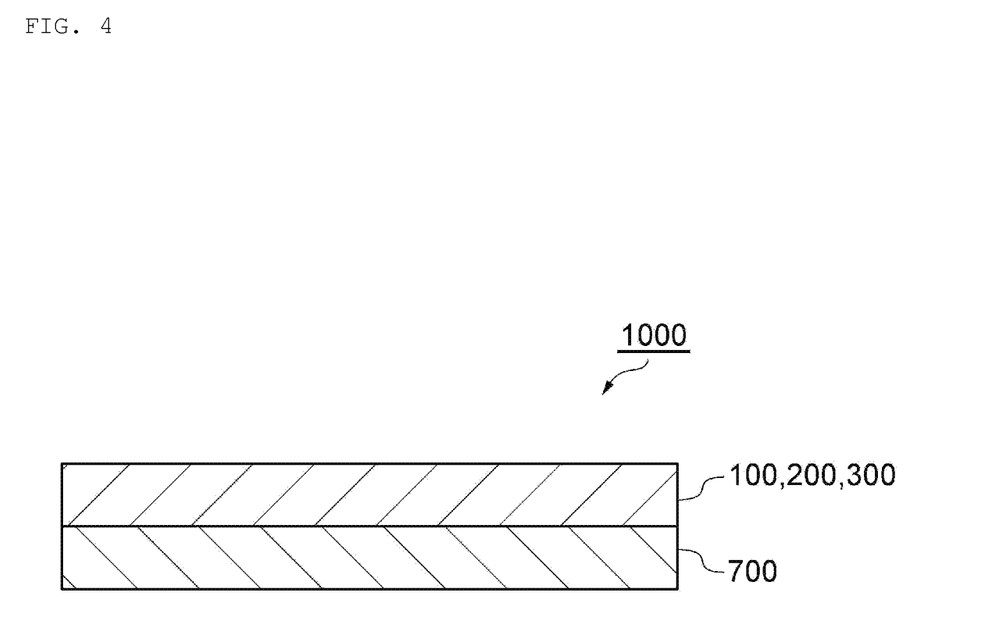
FIG. 4 is a cross-sectional schematic view of a flexible display according to the embodiment of this invention.

As shown in FIG. 4, a flexible display 1000 according to this embodiment includes a flexible image display panel 700 and the gas barrier film 100 provided on a surface of the flexible image display panel 700. In the flexible display 1000, the optical film 200 or the optical film 300 may be used instead of the gas barrier film 100.

As the flexible image display panel 700, a liquid crystal panel or an organic EL panel such as a known TFT may be used.

It is preferable that the optical film 200 or 300 is fixed to the flexible image display panel 700 with the use of the adhesive bonding layer 80 of the optical film 200 or 300. An adhesive bonding layer provided on one surface of the gas barrier film 100 may be applied onto the flexible image display panel 700.

EXAMPLES

Hereinafter, the present invention will be described in detail, according to specific examples. In a gas barrier film, based on the following methods, the static friction coefficient, the arithmetic average roughness Ra, the water vapor permeability, and the flatness were measured; roll conveyability and appearance after conveyance were evaluated; an adhesive bonding layer was prepared, the water diffusion coefficient of the adhesive bonding layer was evaluated, the peel strength between the gas barrier film and the adhesive bonding layer was measured; and moist-heat durability test of the gas barrier film was conducted.

Measurement of Static Friction Coefficient of Gas Barrier Film

The static friction coefficients of gas barrier films were measured in accordance with the inclination method stipulated in JIS P 8147. One of the gas barrier films was fixed to an inclined table such that one surface (A-surface) is directed upward, and the other gas barrier film was fixed to a test piece for weight such that a B-surface opposite to the A-surface is directed downward, and measurement was performed under environments at a temperature of 23° C. and a humidity of 50% RH.

Measurement of Arithmetic Average Roughness Ra of Gas Barrier Film

A gas barrier film was flatly fixed to an epoxy plate with adhesive, and then the arithmetic average roughness Ra of a surface of the gas barrier film was measured under the following conditions using a white-light interference microscope
(Micromap manufactured by Mitsubishi Chemical Systems, Inc.).
[Measurement conditions]
Objective lens: ×10
Data points: 640×480 points Measurement of Water Vapor Permeability of Gas Barrier Film The water vapor permeability of a gas barrier film was measured under conditions at a temperature of 40° C. and a humidity of 90% RH by using a calcium corrosion method (method disclosed in JP-A-2005-283561).

Evaluation of Flatness of Gas Barrier Film

The gas barrier film 100 is held for 48 hours under conditions at a temperature of 23° C. and a humidity of 50 RH %. Then, a 50 mm-square portion is cut from the gas barrier film 100 to obtain a sample. The sample is placed on a horizontal surface such that a central portion of the sample is in contact with the horizontal surface, and distances from the horizontal surface to four corners are obtained. Then, an average value of the obtained four distances is obtained.

Evaluation of Conveyability of Gas Barrier Film

A roll of a gas barrier film having a width of 300 mm to 2000 mm and a length of not less than 100 m was provided, and the film was unwound from the roll to be wound into a roll shape around a different core. In this process, when blocking and winding deviation did not occur and there was no problem in unwinding and winding, it was determined as "good".
When blocking occurred, it was evaluated as "blocking", and when winding deviation occurred, it was evaluated as "winding deviation".

Evaluation of Appearance of Gas Barrier Film After Conveyance

After the above conveyance test, a rectangular region of 210 mm×297 mm was cut from a gas barrier film, and the entire surface of the cut portion was visually confirmed by a surface inspection lamp (FY series manufactured by Funatech Co., Ltd.) and was observed by a microscope (product name: digital microscope, manufactured by Hirox Co., Ltd., a 35× objective lens). If there is no flaw (conveyance flaw), it was determined as "good appearance", and if at least one flaw (conveyance flaw) was confirmed, it was determined as "poor appearance".

Preparation of Adhesive Layer 50 wt % of calcium oxide was mixed with an acrylic copolymer resin (produced by The Nippon Synthetic Chemical Industry Co., Ltd., Coponyl N-7136) and uniformly dispersed. Then, the resultant product was coated onto a release PET film to be dried, and thus to produce an adhesive layer having a thickness of 25 µm. The produced adhesive layer was dried on a hot stage at a temperature of 100° C. for 1 hour.

Evaluation of Water Diffusion Coefficient of Adhesive Layer

After calcium was deposited on a glass plate to have a square shape of 25 mm×25 mm and a thickness of 100 nm, an adhesive layer having a rectangular shape larger than the size of the square calcium layer was applied onto the calcium layer so as to be protruded by a uniform width L to the outside of the calcium layer. Then, a glass plate was further applied onto the adhesive layer, thus producing a water diffusion coefficient evaluation cell. The water diffusion coefficient evaluation cell was put in a thermohygrostat bath having a temperature of 60° C. and a humidity of 90% RH. When the time when edge shrinkage of the square calcium layer was started was represented by A (hr) and a distance (the uniform width) between each side of the adhesive layer and each side of the calcium layer was represented by L (mm), a water diffusion coefficient D ($mm^2$/hr) was obtained by calculation from the formula of $D=L^2/6\theta$. The water diffusion coefficient was 0.03 $mm^2$/hr.

Measurement of Peel Strength Between Gas Barrier Film and Adhesive Layer

The peel strength between a gas barrier film and an adhesive layer was measured in accordance with JIS K 6854-2.
Two gas barrier films were applied with the adhesive layer to avoid entry of bubbles, thus obtaining a three-layer laminate including the gas barrier film/the adhesive layer/the gas barrier film. The three-layer laminate was left to stand in a stationary state for 500 hr under environments at a temperature of 85° C. and a humidity of 85% RH. After that, one of the gas barrier films were flatly fixed to a SUS plate with a bonding agent to be fixed to a lower side of a tensile tester, and the other gas barrier film was folded at 180 degrees to be fixed to a chuck on an upper side of the tensile tester. Peeling was performed at a tensile speed of 2.5 m/min under environments at a temperature of 23° C. and a humidity of 50% RH to measure the peel strength.

Moist-Heat Durability Test of Adhesive Layer

A gas barrier film and an adhesive layer which was dried at a temperature of 100° C. for 1 hour on a hot stage were laminated in a glove box at a temperature of 23° C. (with a water concentration of not more than 10 ppm) to avoid entry of bubbles, thus producing a laminate including the gas barrier film and a sealing adhesive film. Then, after calcium was deposited on a glass plate to have a square shape of 25 mm×25 mm and a thickness of 100 nm, the sealing adhesive film of the produced laminate cut into a square shape of 50 mm×50 mm was applied onto the glass plate to avoid entry of bubbles in the glove box such that four sides of a calcium deposition portion and four sides of the laminate were parallel to each other, thus producing a moist-heat durability test cell. Application was performed such that distances between the four sides of the laminate and the four sides of the calcium deposition portion were each 12.5 mm.

The obtained moist-heat durability test cell was put in a thermohygrostat bath having a temperature of 60° C. and a humidity of 90% RH and left to stand in a stationary state for 1000 hours. Then, the cell was taken out therefrom, and when none of point defect, lowering of permeability, and edge shrink (transparentization from end portions at four sides) occurs in a calcium deposition surface, it was determined as "no degradation".

Production Process 1 of Inorganic Thin Film Layer

A flexible substrate was attached to a feed roll in a vacuum chamber, and the pressure in the vacuum chamber was adjusted to not more than $1 \times 10^{-3}$ Pa. Then, an inorganic thin film layer was film-formed on the flexible substrate. In a plasma enhanced CVD system used for forming an inorganic thin film layer, a flexible substrate was conveyed while being in close contact with surfaces of a pair of roll-shaped electrodes, and plasma was generated between a pair of electrodes to decompose a raw material in the plasma and thus to form the inorganic thin film layer on the flexible substrate. In the pair of electrodes, magnets are disposed inside the electrodes so that a magnetic flux density increases on the surfaces of the electrodes and the surface of the flexible substrate, and plasma is constrained at a high density on the electrodes and the flexible substrate when the plasma is generated. In the film-formation of the inorganic thin film layer, hexamethyldisiloxane gas was introduced at 100 sccm (Standard Cubic Centimeter per Minute, 0° C., 1 atmospheric pressure basis), and oxygen gas was introduced at 900 sccm toward a space between the electrodes which was to be a deposition zone. AC electric power of 0.6 kW at a frequency of 70 kHz was supplied between electrode rolls to discharge electricity and thus to generate plasma. Then, the displacement was regulated such that a pressure in the vicinity of a vent in the vacuum chamber became 1 Pa, and then a dense inorganic thin film layer was formed on the flexible substrate by a plasma CVD method.

The obtained inorganic thin film layer was constituted of an oxygen atom, a silicon atom, a carbon atom, and a hydrogen atom. When infrared spectrometry (FT-IR) was conducted, an absorption intensity ratio ($I_2/I_1$) between the peak intensity ($I_1$) existing from 950 to 1050 $cm^{-1}$ and the peak intensity ($I_2$) existing from 1240 to 1290 $cm^{-1}$ was determined from the obtained infrared absorption spectrum, and the result was $I_2/I_1=0.03$. When an absorption intensity ratio ($I_3/I_1$) between the peak intensity ($I_1$) existing from 950 to 1050 $cm^{-1}$ and the peak intensity ($I_3$) existing from 770 to 830 $cm^{-1}$ was determined, the result was $I_3/I_1=0.37$. When an absorption intensity ratio ($I_4/I_3$) between the peak intensity ($I_3$) existing from 770 to 830 $cm^{-1}$ and the peak intensity ($I_4$) existing from 870 to 910 $cm^{-1}$ was determined, the result was $I_4/I_3=0.91$. XPS depth profile measurement was conducted, average atomic concentrations in the thickness direction of respective atoms were determined from obtained distribution curves of a silicon atom, an oxygen atom, and a carbon atom, and then the average atomic number ratios C/Si and O/Si were calculated, so that the average atomic number ratios C/Si=0.65 and O/Si=1.58.

Production Process 2 of Inorganic Thin Film Layer

An inorganic thin film layer was formed on a flexible substrate as in the production process 1 except that a supply amount of oxygen gas was 2000 sccm, AC electric power supplied between electrode rolls was 0.8 kw, and the displacement was regulated such that a pressure in the vicinity of a vent in the vacuum chamber was 3 Pa. XPS depth profile measurement was conducted, average atomic concentrations in the thickness direction of respective atoms were determined from obtained distribution curves of a silicon atom, an oxygen atom, and a carbon atom, and then the average atomic number ratios C/Si and O/Si were calculated, so that the average atomic number ratios C/Si=0.29 and O/Si=1.74.

Production Process 3 of Inorganic Thin Film Layer

An inorganic thin film layer was formed on a flexible substrate as in the production process 1 except that a supply amount of oxygen gas was 1400 sccm, AC electric power supplied between electrode rolls was 1.2 kw, and the displacement was regulated such that a pressure in the vicinity of a vent in the vacuum chamber was 5 Pa.

Example 1

Only a cycloolefin polymer film (produced by Zeon Corporation, ZF16, thickness of 50 μm, described as COP1) having an arithmetic average roughness Ra of 0.8 nm was used as a flexible substrate, and an inorganic thin film layer A having a film thickness of 300 nm was formed on one of the surfaces (A-surface) of the flexible substrate by the production process 1. The arithmetic average roughness Ra of the inorganic thin film layer A was 1.2 nm. Then, an inorganic thin film layer B having a thickness of 300 nm was formed on the other surface (B-surface) of the flexible substrate by the production process 3 to obtain a gas barrier film. The film formation pressure and thickness were adjusted such that stresses of the inorganic thin film layer A and the inorganic thin film layer B were balanced, so that the flatness was 0.2 mm. The arithmetic average roughness Ra of the inorganic thin film layer B was 3.8 nm. The static friction coefficient between front and rear surfaces was 1.6.

Example 2

After corona treatment was applied to one of the surfaces (A-surface) of COP1, a planarizing layer (UV3701 available from Toagosei Co., Ltd., film thickness of 1.5 μm, average surface roughness of 0.5 nm) was formed on the A-surface with the use of a transparent UV curable resin to obtain a flexible substrate having two layers. An inorganic thin film layer A having a film thickness of 850 nm was formed on one of the surfaces (A-surface having the planarizing layer) of the flexible substrate by the production process 1. The arithmetic average roughness Ra of the inorganic thin film layer A on the planarizing layer side was 0.9 nm. An inorganic thin film layer B having a film thickness of 850 nm was formed on the other surface (B-surface) of the flexible substrate under the conditions of the production process 3 to obtain a gas barrier film. The film formation pressure and thickness were adjusted such that stresses of the inorganic thin film layer A having the planarizing layer and the inorganic thin film layer B were balanced, so that the flatness was 0.3 mm. The arithmetic average roughness Ra of the inorganic thin film layer B on the COP1 side was 4.5 nm. The static friction coefficient between front and rear surfaces was 1.0.

Example 3

Example 3 was similar to Example 2 except that there was used a flexible substrate in which after corona treatment was applied to one of the surfaces (A-surface) of a λ/4 phase difference film formed of cycloolefin polymer (produced by Zeon Corporation, ZM16-138, thickness of 86 μm, arithmetic average roughness Ra of 0.9 nm, described as COP2), a planarizing layer (UV3701 available from Toagosei Co., Ltd., film thickness of 1.5 μm, average surface roughness of 0.5 nm) was formed on the A-surface with the use of a UV curable resin. The arithmetic average roughness Ra of an inorganic thin film layer A on the planarizing layer side was 0.9 nm. The arithmetic average roughness Ra of an inorganic thin film layer B on the COP2 side was 4.3 nm. The film formation pressure and thickness were adjusted such that stresses of the inorganic thin film layer A having the planarizing layer and the inorganic thin film layer B were balanced, so that the flatness was 0.4 mm.

Example 4

An inorganic thin film layer A having a film thickness of 220 nm was formed on one of the surfaces of COP1. The arithmetic average roughness Ra of the inorganic thin film layer A was 1.0 nm.

Then, an inorganic thin film layer B having a thickness of 300 nm was formed on the other surface (B-surface) of the COP1 by the production process 3 to obtain a gas barrier film. The thickness were adjusted such that stresses of the inorganic thin film layer A and the inorganic thin film layer B were balanced, so that the flatness was 0.5 mm. The arithmetic average roughness Ra of the inorganic thin film layer B was 3.8 nm. The static friction coefficient between front and rear surfaces was 0.9.

Comparative Example 1

Comparative Example 1 was similar to Example 1 except that inorganic thin film layers A and B were formed on both surfaces of COP1 under the conditions of the production process 1. The arithmetic average roughness Ra of each of the inorganic thin film layers A and B was 1.2 nm.

Comparative Example 2

A PET film (biaxial stretching, one-side release treated, thickness of 75 μm) was used as a flexible substrate, and an inorganic thin film layer A having a film thickness of 500 nm was formed on a surface opposite to a release-treated surface of the PET film under the conditions of the production process 1. The arithmetic average roughness Ra of an inorganic thin film layer A was 1.8 nm. The arithmetic average roughness Ra of the release-treated surface of the PET film was 3.0 nm.

Tables 1 and 2 show the conditions and results.

TABLE 1

| | Inorganic thin film layer A | | | Flexible substrate | | Inorganic thin film layer B | | |
|---|---|---|---|---|---|---|---|---|
| | Thickness | Production process | Arithmetic average roughness Ra | Layer 2 (planarizing layer) | Layer 1 | Thickness | Production process | Arithmetic average roughness Ra |
| Example 1 | 300 nm | 1 | 1.2 nm | — | COP1 | 300 nm | 3 | 3.8 nm |
| Example 2 | 850 nm | 1 | 0.9 nm | UV curable resin | COP1 | 850 nm | 3 | 4.5 nm |
| Example 3 | 850 nm | 1 | 0.9 nm | UV curable resin | COP2 | 850 nm | 3 | 4.3 nm |
| Example 4 | 220 nm | 2 | 1.0 nm | — | COP1 | 300 nm | 3 | 3.2 nm |
| Comparative Example 1 | 300 nm | 1 | 1.2 nm | — | COP1 | 300 nm | 1 | 1.2 nm |
| Comparative Example 2 | 500 nm | 1 | 1.8 nm | — | PET | — | — | — |

TABLE 2

| | Static friction coefficient between front and rear surfaces of gas barrier film | Flatness of gas barrier film (mm) | Water vapor permeability of gas barrier film (g/m$^2$ · day) | Conveyability of gas barrier film | Appearance of gas barrier film after conveyance | Peel strength between adhesive layer and gas barrier film (gf/10 mm) | Moist-heat durability test of adhesive layer |
|---|---|---|---|---|---|---|---|
| Example 1 | 1.6 | 0.2 | 0.001 | Good | Good | — | — |
| Example 2 | 1.0 | 0.3 | 0.00001 | Good | Good | — | — |
| Example 3 | 1.2 | 0.4 | 0.0002 | Good | Good | 1000 | No degradation |
| Example 4 | 0.9 | 0.5 | 0.02 | Good | Good | — | — |
| Comparative Example 1 | 5.0 | 0.5 | 0.02 | Blocking | Poor | — | — |
| Comparative Example 2 | 0.7 | 4.0 | 0.05 | Winding deviation | Good | — | — |

What is claimed is:

1. A gas barrier film comprising: a flexible substrate; and an inorganic thin film layer formed on at least one surface of the flexible substrate,
wherein a static friction coefficient between one surface of the gas barrier film and the other surface is not less than 0.85 and not more than 2.0, and
when a 50 mm-square portion cut from the gas barrier film is placed on a horizontal surface such that a central portion of the 50 mm-square portion is in contact with the horizontal surface, an average value of distances from the horizontal surface to four corners of the 50 mm-square portion is not more than 2 mm,
wherein the inorganic thin film layer contains at least a silicon atom (Si), an oxygen atom (O), and a carbon atom (C),
wherein the inorganic thin film layer comprises a silicon distribution curve, an oxygen distribution curve, and a carbon distribution curve,
in the silicon distribution curve, the oxygen distribution curve, and the carbon distribution curve which are in the thickness direction of the inorganic thin film layer, the carbon distribution curve has at least one external value, and
wherein the inorganic thin film layer forms an exposed surface of the gas barrier film.

2. The gas barrier film according to claim 1, wherein when any one surface of the gas barrier film is observed by a white-light interference microscope, an arithmetic average roughness Ra is not less than 3 nm.

3. The gas barrier film according to claim 1, wherein a water vapor permeability of the gas barrier film at 40° C. and 90% RH is not more than 0.1 g/m²/day.

4. The gas barrier film according to claim 1, wherein a water vapor permeability of the gas barrier film at 40° C. and 90% RH is not more than 0.001 g/m²/day.

5. The gas barrier film according to claim 1, wherein the inorganic thin film layer contains silicon atoms, oxygen atoms, and carbon atoms.

6. An optical film comprising the gas barrier film according to claim 1, a $\lambda/4$ phase difference film, and a linear polarizer layer.

7. The optical film according to claim 6 further comprising a $\lambda/2$ phase difference film.

8. The optical film according to claim 6, wherein the $\lambda/4$ phase difference film has reverse wavelength dispersibility.

9. The optical film according to claim 6 further comprising an adhesive bonding layer.

10. The optical film according to claim 9, wherein after storage for 500 hr under environments at 85° C. and 85% RH, adhesive strength between the gas barrier film and the adhesive bonding layer is not less than 500 gf/10 mm.

11. The optical film according to claim 9, wherein a water diffusion coefficient in an in-plane direction of the adhesive bonding layer is not more than 0.05 mm²/hr under environments at 60° C. and 90% RH.

12. A flexible display comprising the optical film according to claim 6.

13. The gas barrier film according to claim 1, wherein the flexible substrate is a $\lambda/4$ phase difference film.

14. The gas barrier film according to claim 13, wherein the flexible substrate has reverse wavelength dispersibility.

15. An optical film comprising the gas barrier film according to claim 13 and a linear polarizer layer.

16. The optical film according to claim 15 further comprising a $\lambda/2$ phase difference film.

17. The optical film according to claim 15 further comprising an adhesive bonding layer.

18. The optical film according to claim 17, wherein after storage for 500 hr under environments at 85° C. and 85% RH, adhesive strength between the gas barrier film and the adhesive bonding layer is not less than 500 gf/10 mm.

19. The optical film according to claim 17, wherein a water diffusion coefficient in an in-plane direction of the adhesive bonding layer is not more than 0.05 mm²/hr under environments at 60° C. and 90% RH.

20. A flexible display comprising the optical film according to claim 15.

21. A flexible display comprising the gas barrier film according to claim 13.

22. A flexible display comprising the gas barrier film according to claim 1.

23. The gas barrier film according to claim 1, wherein the thin film layer shows an intensity ratio between a peak intensity ($I_1$) existing from 950 to 1050 cm$^{-1}$ and a peak intensity ($I_2$) existing from 1240 to 1290 cm$^{-1}$ fall within the range satisfying the following formula (2) when infrared spectrometry is conducted on a surface of the inorganic thin film layer:

$$0.01 \leq I_2/I_1 < 0.05 \qquad (2).$$

24. The gas barrier film according to claim 1, an inorganic thin film layer formed on both surfaces of the flexible substrate.

* * * * *